United States Patent [19]

Shyu

[11] Patent Number: 4,962,004

[45] Date of Patent: Oct. 9, 1990

[54] METHOD OF INHIBITING ELECTROCHEMICAL REDUCTION OF POLYIMIDE DURING ELECTROPLATING AND ARTICLES FORMED THEREBY

[75] Inventor: Jieh-Hwa Shyu, Windham, N.H.

[73] Assignee: Digital Equipment Corporation, Maynard, Mass.

[21] Appl. No.: 406,647

[22] Filed: Sep. 13, 1989

[51] Int. Cl.⁵ .............................................. C25D 5/56
[52] U.S. Cl. ...................................... 428/626; 204/20; 204/22; 204/38.7; 204/45.1; 204/47.5
[58] Field of Search ................. 204/20, 22, 38.7, 47.5, 204/45.1; 428/626

[56] References Cited

U.S. PATENT DOCUMENTS 3,617,452 11/1971 Keith et al. .................. 204/47.5 X
3,637,473 1/1972 Greenspan et al. ............... 204/47.5
4,832,799 5/1989 Knudsen et al. ..................... 204/22

FOREIGN PATENT DOCUMENTS 0215557 3/1987 European Pat. Off. .

Primary Examiner—G. L. Kaplan
Attorney, Agent, or Firm—Nutter, McClennen & Fish

[57] ABSTRACT

A method of inhibiting degradation of the metal-polyimide bond of a metal-polyimide composite due to electrochemical reduction of the polyimide while electroplating wherein the electroplating process is carried out in an ammonium ions-based plating solution.

14 Claims, No Drawings

METHOD OF INHIBITING ELECTROCHEMICAL REDUCTION OF POLYIMIDE DURING ELECTROPLATING AND ARTICLES FORMED THEREBY

This invention relates to the prevention of polyimide-metal interface degradation of a polyimide-metal composite during electroplating. It relates more particularly to a method of inhibiting electrochemical reduction of the polyimide during electroplating by relying on an ammonium ions-based plating solution.

BACKGROUND OF THE INVENTION

Polyimide, or more specifically aromatic poly (etherimide) such as the one sold under the brand name Kapton, is used widely in electronic and microelectronic fabrication because of its high temperature stability and low dielectric constant. This material, in the form of a film or tape, is used, for example, as the substrates of lead frames and so-called TAB tapes in IC chip packaging as well as the substrates of flexible printed circuits of more general application. The lead frames and circuits are metal-polyimide composites with the metal often applied directly to one or both sides of the substrate by known electroplating processes as described, for example, in U.S. Pat. No. 4,832,799, or by vacuum sputtering or electroless processes. The metal which ultimately forms the conductive traces or paths of the lead frame or circuit is usually copper, although there may be an intermediate layer of cobalt or nickel between the copper and the substrate to optimize the bond between the metal and the substrate.

Sometimes, gold, nickel or other metal is plated directly on a polyimide film substrate. Very often, specifications require that the metal component of the metal-polyimide composite, e.g. a lead frame, be plated with gold, gold alloy, nickel or other metal. Both processes require the immersion of the composite or substrate in an electroplating solution which typically contains ions of an alkali metal such as cesium, potassium or sodium to improve the conductivity of the solution.

Polyimide has a disadvantage in that its electrochemical activities often cause severe degradation of the polyimide structure at the metal-polyimide interface due to electrochemical reduction of the polyimide during the electroplating process. Although reduction of a polyimide is energetically disfavored because of the relatively low electron affinity of the bound oxygen atoms, the reduced species will be somewhat stable if surrounded with cations that serve to offset or mitigate the negative charge. Such reduction results in degradation or a weakening of the bond between the metal and the polyimide.

There are two criteria necessary for the degradation of the polyimide to occur. Firstly, the reduction potential during the electroplating process must be high enough to cause electrochemical reduction of the polyimide. Accordingly, this problem is particularly severe when electroplating a metal such as gold, gold alloy or nickel which requires a high cathodic potential. Secondly, as noted above, the electron charge of the reduced polyimide must be neutralized by cations in order for the reduction to continue. Otherwise, the buildup of the electric field by the accumulated negative charges in the polyimide will counter-balance the external voltage applied during the plating process and further reduction of the polyimide will stop.

Thus, the rate of the electrochemical reduction of the polyimide is dependent upon the mobility of the cations in the polyimide. As is known, the cation with the smaller hydrated ionic radius has a faster diffusion coefficient within the polymer. It turns out that the ions of the alkali metals such as cesium, potassium and sodium often present in the electroplating solution, as noted above, have small ionic radii. Therefore, those cations actually promote reduction of the polyimide and, therefore, contribute to the deterioration of the polyimide-metal bond.

It is possible to inhibit electrochemical reduction of the polyimide under such circumstances by adjusting the composition of the plating solution or the plating conditions such as the electrolyte PH or the plating current density. However those solutions to the problem may prevent using optimum plating conditions. In other words, the chemistry and/or conditions for optimum electroplating and the chemistry and/or conditions for minimum polyimide reduction may be mutually antagonistic.

Accordingly, the present invention aims to minimize polyimide-metal interface degradation of a polyimide-metal composite such as a lead frame or flexible circuit during electroplating by inhibiting electrochemical reduction of the polyimide during plating and without adversely affecting the plating process.

SUMMARY OF THE INVENTION

In accordance with this invention, the electrochemical reduction of the polyimide component of a metal-polyimide composite during electroplating is inhibited or prevented by carrying out the plating process in an ammonium ions-based electroplating solution.

In other words, I have found that among all the cations commonly used in electroplating processes, ammonium ions have the unique property of eliminating or greatly inhibiting the electrochemical reduction of polyimide, and therefore, of reducing or eliminating degradation of the polyimide structure at the polyimide-metal interface of a polyimide-metal composite structure. Thus according to this invention, ammonium ions replace any cations in the electroplating bath which have the potential of promoting electrochemical reduction of the polyimide during the plating process. For example, in the case of gold plating, an ammonium gold cyanide plating solution may be used.

It should be understood that the effects of ammonia on polyimide have been studied before. It is known that ammonia has a tendency to interact chemically with polyimide at room temperature in the following manner:

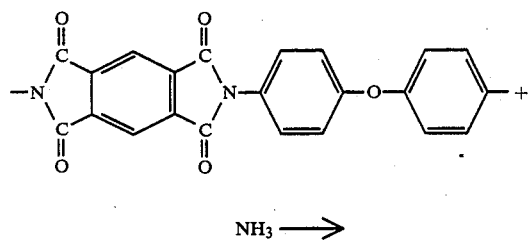

-continued

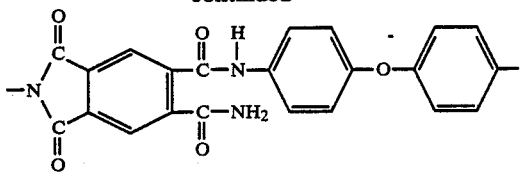

Apparently, this reaction causes the diffusion coefficient of ammonia in polyimide to be at least 2 to 3 orders of magnitude smaller than those of other molecules such as water and oxygen. This occurs since the aforesaid reaction changes the polymer to make it resistant to further diffusion of ammonia. Ammonia is a weak base. Therefore, when used in an electroplating solution virtually any ammonium salt in solution will equilibrate quickly to ammonium hydroxide $NH_3 \cdot H_2O$ and the fully ionized acid $NH_4+$. It is suspected that the ammonium ion is unstable in an ionic state and therefore takes the form of the neutral hydrated ammonia species as follows:

$$NH_4^+ + H_2O \rightarrow H^+(\text{ionized}) + NH_3 \cdot H_2O$$

Thus by replacing the alkali metal cations with ammonium ions which result in an electrically neutral hydrated ammonia species with a very low diffusion coefficient within the polyimide, polyimide reduction is disfavored because of cation starvation. With the polyimide reduction greatly inhibited or stopped, there should be little or no degradation of the polyimide structure at the metal-polyimide interface and minimal or no weakening of the bond there.

SPECIFIC DESCRIPTION Actual tests have been performed on a single metal two layer TAB tape with no adhesive layer (copper conductors on Kapton) using Potentiostat electroplating equipment and an Engelhard EHS high speed gold plating solution. This is a commercial product in which all of the potassium or sodium cations commonly used in commercial gold plating processes are replaced with ammonium ions. It is a specialty plating bath designed for high current density capability and, to applicant's knowledge, used only for high-speed wire plating applications.

The conditions and results of two such tests were as follows:

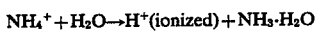

| Comparative Example 1 | |
|---|---|
| Temperature | 70° C. |
| Voltage | −820 mV with respect to the saturated Calomel reference electrode |
| Current | 200 ma |
| Plating Time | 9 minutes |

Results: No color change in the polyimide was observed and there was no degradation of the polyimide-metal interface adhesion strength as tested by peeling off the metal conductors after immersing the sample in boiling water for 20 minutes.

| Example 2 | |
|---|---|
| Temperature | 71° C. |
| Voltage | −900 mV with respect to the same reference electrode |
| Current | 400 ma |
| Plating Time | 4 minutes |

Results: Same as in Comparative Example 1

It will thus be seen that the objects set forth above, among those made apparent from the preceding description, are efficiently attained and, since certain changes may be made in the above method and in the above constructions without departing from the scope of the invention, it is intended that all matter contained in the above description shall be interpreted as illustrative and not in a limiting sense.

It is also to be understood that the following claims are intended to cover all of the generic and specific features of the invention described herein.

I claim:

1. A method of inhibiting degradation of the metal-polyimide bond of a metal-polyimide laminate due to electrochemical reduction of the polyimide during electroplating comprising performing the plating process in an ammonium ions-based plating solution all of whose cations except the metal being plates consist of ammonium ions.

2. The method defined in claim 1 wherein the plating process is performed using an ammonium gold cyanide plating solution.

3. The method defined in claim 1 wherein said laminate is a lead frame or printed circuit.

4. The method defined in claim 1 wherein the polyimide component of the laminate is polyimide film.

5. A method of inhibiting diffusion of polyimide reduction-promoting cations into the polyimide component of a metal-polyimide laminate during electroplating comprising performing the plating process using an ammonium ions-based plating solution all of whose cations except the metal being plated consist of ammonium ions.

6. The method defined in claim 5 wherein the polyimide component of said laminate is polyimide tape.

7. The method defined in claim 5 wherein said solution is an ammonium gold cyanide-based electrolyte.

8. The method defined in claim 5 wherein said solution is a high speed gold plating solution.

9. A carrier comprising a metal-polyimide laminate and a second metal electroplated onto the metal component of the laminate characterized in that the carrier is substantially devoid of electrochemical reduction-caused deterioration of the carrier's meal-polyimide bond due to the second metal having been electroplated in an ammonium ions-based electroplating solution all of whose cations except the metal being plated consist of ammonium ions.

10. An article of manufacture comprising a polyimide body and a metal electroplated onto a surface of said body in an ammonium ions-based electroplating solution all of whose cations except the metal being plated consist of ammonium ions whereby the article is substantially free of electrochemical reduction-caused deterioration of the article's metal-polyimide bond.

11. The article of manufacture defined in claim 10 wherein the polyimide body comprises polyimide tape.

12. The article of manufacture defined in claim 10 wherein said metal is selected from the group consisting of gold, gold alloy and nickel.

13. A method of applying a metal layer to the surface of a polyimide film comprising electroplating the metal onto the film surface using an ammonium ions-based plating bath all of whose cations consist of the metal being plated and ammonium ions.

14. A method of applying a metal layer to the surface of a metal-polyimide laminate comprising electroplating the metal layer onto the metal surface of the laminate using an ammonium ions-based plating solution all of whose cations consist of the metal being plated and ammonium ions.

* * * * *